United States Patent [19]
Sakitani

[11] 3,952,215
[45] Apr. 20, 1976

[54] STEPWISE FINE ADJUSTMENT

[75] Inventor: Yoshio Sakitani, Katsuta, Japan

[73] Assignee: Hitachi, Ltd., Japan

[22] Filed: Apr. 18, 1972

[21] Appl. No.: 245,077

[30] Foreign Application Priority Data
Apr. 21, 1971 Japan............................ 46-25246

[52] U.S. Cl.................... 310/8.1; 318/116; 318/135; 310/8.3
[51] Int. Cl.² ........................................ H01L 41/08
[58] Field of Search ............ 310/8.0, 8.1, 8.3, 8.5, 310/8.7, 8.6, 9.1, 26; 318/116, 118, 135; 317/262 E

[56] References Cited
UNITED STATES PATENTS

| | | | |
|---|---|---|---|
| 2,506,141 | 5/1950 | Drovin................. | 318/118 |
| 2,506,141 | 5/1950 | Drovin................. | 318/118 |
| 2,834,943 | 5/1958 | Grisdale et al........ | 310/8.1 X |
| 2,859,962 | 11/1958 | Beveridge et al..... | 317/262 E |
| 2,897,424 | 7/1959 | Waring................. | 317/262 E |
| 3,138,749 | 6/1964 | Stibitz................. | 310/26 X |
| 3,138,749 | 6/1964 | Stibitz................. | 310/26 X |
| 3,217,218 | 11/1965 | Steel.................... | 318/118 |
| 3,377,489 | 4/1968 | Brisbane.............. | 310/8.3 |
| 3,389,274 | 6/1968 | Robertson............ | 310/26 X |
| 3,389,274 | 6/1968 | Robertson............ | 310/8.6 X |
| 3,390,559 | 7/1968 | Steutzer............... | 310/8.6 X |
| 3,394,274 | 7/1968 | Jacke et al........... | 310/26 X |
| 3,473,466 | 10/1969 | Thayer................. | 310/26 X |
| 3,551,764 | 12/1970 | Evans................... | 310/8.1 X |
| 3,578,996 | 5/1971 | Balamuth.............. | 310/26 |
| 3,649,856 | 3/1972 | O'Neill................. | 310/8.3 |
| 3,684,904 | 8/1972 | Galutva................ | 310/8.3 |
| 3,702,948 | 11/1972 | Balamuth.............. | 310/26 |

*Primary Examiner*—Mark O. Budd
*Attorney, Agent, or Firm*—Craig & Antonelli

[57] ABSTRACT

A variable d.c. source is connected to electrodes provided on the inner and outer surfaces of a hollow cylindrical body formed of piezoelectric ceramic through a switch to achieve dilations of the body by a variable applied voltage.

Leg members are fixed at both ends of said body member. Sliding members are further fixed on the lower surfaces of said leg members and are slidable on a base plate. Between said leg members and said base plate, d.c. sources are connected through switches to electrostatically fix the structure. The structure can be moved finely and stepwise in a predetermined direction by operating said switches.

10 Claims, 12 Drawing Figures

STEPWISE FINE ADJUSTMENT

BACKGROUND OF THE INVENTION

1. Field of the Invention

This invention relates to an apparatus for fine adjustment of position of an object and more particularly to stepwise displacement of an object of a very minute unit length.

2. Description of the Prior Art

Fine positioning adjustment to an accuracy below one micron is often needed in the field of accurate devices. Particularly, specimens should be moved to an extremely high accuracy in observation, measurement and treatment instruments using X-rays or charged particles.

Thus, various types of fine movement devices have been used, but they use purely mechanical structures utilizing screws, cams, levers, etc. Larger devices are needed for achieving higher accuracy. Further, it is impossible to completely remove minute errors due to structural coupling of mechanical elements.

An example of a specimen positioning mechanism used in conventional electron-microscopes is shown in FIG. 1, where rotation of a knob 11 is transformed into linear motion and pushes a specimen substrate 1 through a pin 12. The knob 11 is fixed on one end of a transmission rod 9. The transmission rod 9 is supported by a holder 10 and has a fine movement screw portion 4 at the other end. The screw portion 4 transforms rotating motion into linear motion. The linear motion is transmitted through a construction lever 3, and a transmission rod 2 supported by a joint 5 and a push pin 12, to the specimen substrate 1. The specimen substrate 1 supporting a specimen cylinder 6 is positioned at a rest position using push-springs 13 and pull-springs 8. Fine movement is given to such a specimen substrate using said mechanism to finely adjust the position of the specimen with respect to an electron lens 7.

This conventional fine movement device of purely mechanical structure has, however, a large drawback that since every mechanical joint portion is accompanied with a tolerance, such tolerances are successively multiplied from the knob 11 to the specimen substrate 1 to cause a large positioning error. Further, each mechanical joint portion is positioned only by spring force. When external vibration is transmitted to or thermal expansion is caused in the mechanical elements, the positioning accuracy is inevitably much decreased.

SUMMARY OF THE INVENTION

This invention is made to remove said drawbacks in such a fine positioning mechanism.

An object of this invention is to provide a fine positioning mechanism capable of moving an object to an extremely high accuracy utilizing piezoelectric effects and electrostatic force.

In this invention, a desired fine motion can be made by purely electrostatic means by the use of minute dilations of a member showing an inverse piezoelectric effect under the application of an electric field.

DESCRIPTION OF THE PREFERRED EMBODIMENTS

Figure 1:
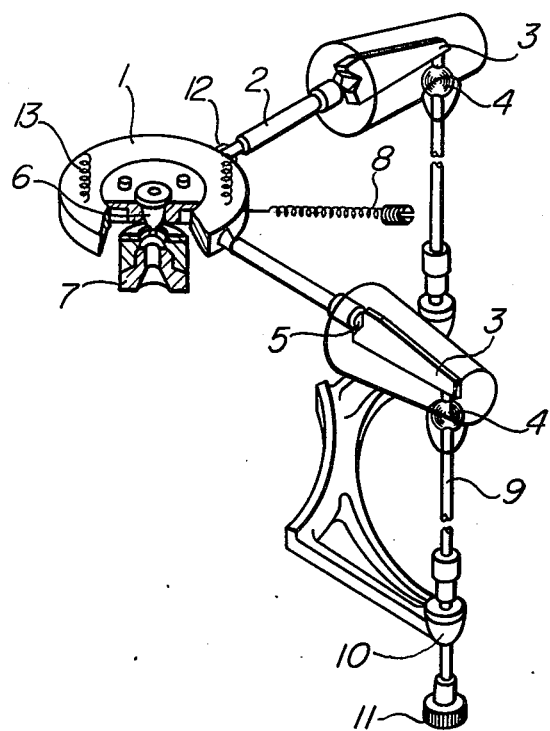
FIG. 1 is a schematic view of an example of a conventional fine positioning mechanism.
Figure 2:
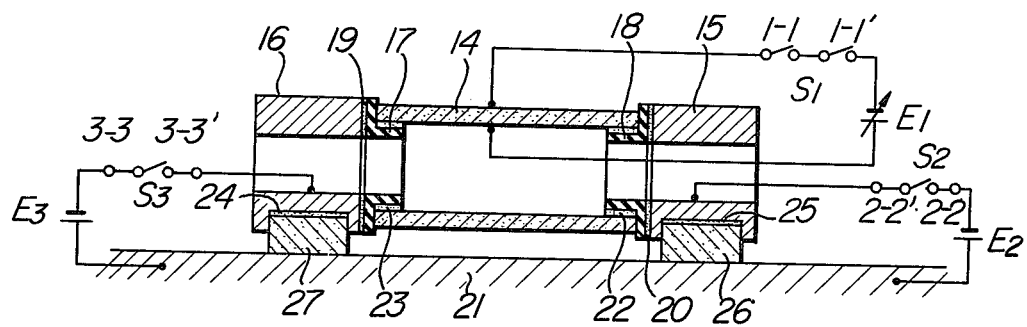
FIG. 2 is a schematic cross-section of a fine positioning device showing a basic structure of this invention.

A basic structure of the present fine positioning device will be described in connection with FIG. 2. In the figure, reference numeral 14 indicates a cylindrical body member made of a material showing inverse piezoelectric effect, 15 and 16 leg members of conductive material fixed at both ends of said body member 14, 26 and 27 sliding members of semiconductive dielectric material fixed on the lower surfaces of said leg members 15 and 16, and 21 a plane plate of conductive material.

The body member 14 is formed of a piezoelectric ceramics having a large conversion factor from electric to mechanical signal and preferably formed in a cylindrical shape to maximize the inverse piezoelectric effect. Electrodes are provided with on the inner and outer surfaces of the hollow body member for applying an electric field. Between these electrodes, a variable d.c. voltage source $E_1$ is connected through a switch $S_1$. The body member 14 expands or contracts in the axial direction in proportion to the applied voltage. The leg members 15 and 16 are fixed at both ends of the body member 14 through binder 20 and 19, insulators 18 and 17, and binder 22 and 23, respectively. The sliding members 26 and 27 formed of semiconductive material are fixed on the lower surfaces of said leg members 15 and 16 through electrically conductive binder 25 and 24. These sliding members 26 and 27 can slide smoothly on the plane substrate 21. A pair of d.c. sources $E_2$ and $E_3$ are connected between the two leg members 15, 16 and the substrate 21 through switches $S_2$ and $S_3$, respectively. When a voltage is applied between each electrode and the substrate, a large electrostatic attractive force works between the leg member and the substrate to press the sliding member strongly on the substrate and hence position each of the leg members. Here, said leg member may be wholly made of semiconductive dielectrics unitary with the sliding member.

Figure 3:
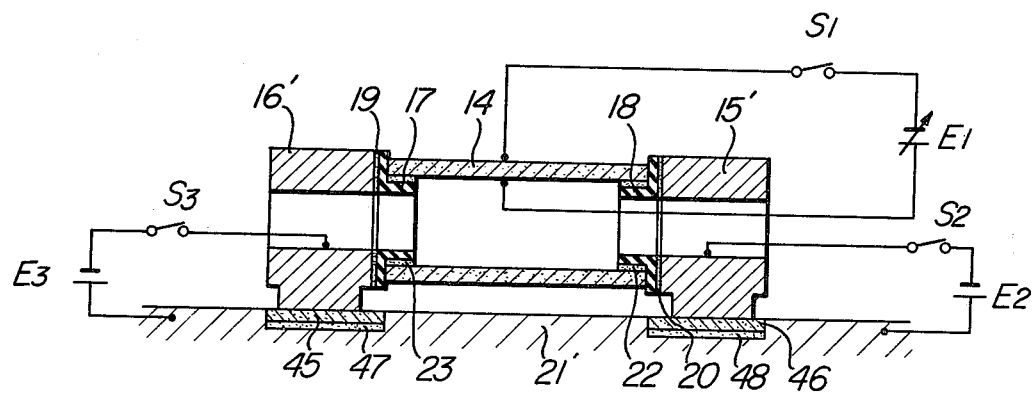
FIG. 3 is a schematic cross-section of another structure of the fine positioning device of this invention.

Further, another structure as shown in FIG. 3 may be employed in which semiconductive members 45 and 46 are fixed on a substrate 21' through electrically conductive binder 47, 48, and leg members 16' and 15' formed of conductive material are fixed at both ends of the body member 14 using insulators 17, 18 and binder to be capable of sliding on the upper surface of said semiconductive members 45 and 46.

In the structure as described above, the two leg members can be alternately moved stepwise by alternately releasing the positioning of the two leg members fixed at the ends of the body member and allowing an expansion or contraction of the body member in each interval.

The operation of the present structure will be described referring to FIGS. 4a to 4f, in which sliding members are dispensed with for simplifying the illustration. A positioned leg member is shown as touching to the substrate and a released leg member is shown separated from the substrate.

Figure 4:
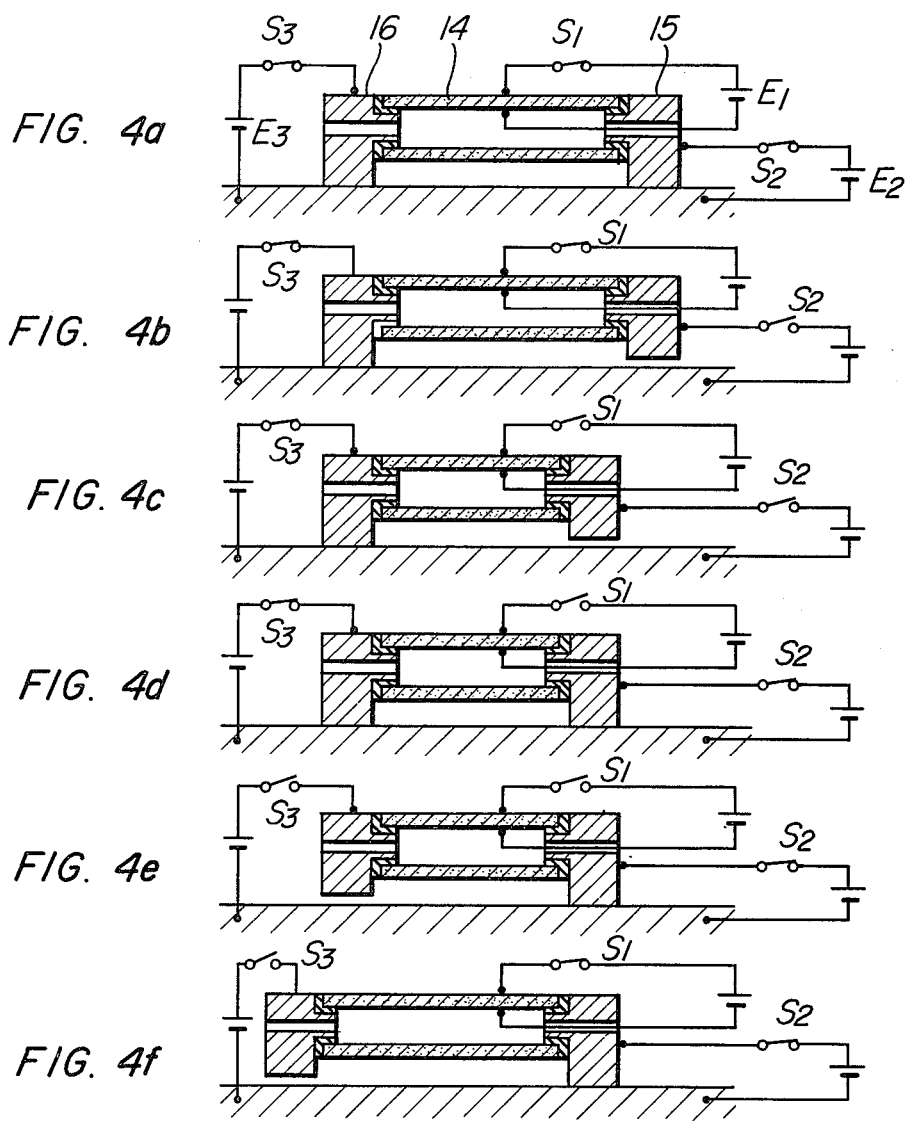
FIGS. 4a to 4f illustrate how the present device of FIG. 2 is operated.

When all of the switches $S_1$, $S_2$ and $S_3$ are closed as is shown in FIG. 4a, the body member 14 exhibits an expansion $\Delta$ proportional to the applied voltage $E_1$ by the inverse piezoelectric effect and the leg members 15 and 16 at both ends of said body member are positioned by the coulomb force working between the leg members and the substrate. When the switch $S_2$ is opened, the coulomb attractive force between the leg member 15 and the substrate disappears and the leg member 15 is released, as is shown in FIG. 4b. When the switch $S_1$ is opened next, the dilation $\Delta$ of the body member 14 disappears and the released leg member 15 is moved by $\Delta$ to the left as is shown in FIG. 4c. Then, the switch $S_2$ is closed to fix the leg member 15 on the substrate as is shown in FIG. 4d. When the switch $S_3$ is opened and the switch $S_1$ is closed, the leg member 16 is released (FIG. 4e) and then moved to the left by $\Delta$ due to the expansion of the body member 14 (FIG. 4f). If the switch $S_3$ is closed, the leg member 16 is fixed and the state shown in FIG. 4a is reproduced. Here, it is clear that the two leg members 15 and 16 are both shifted by $\Delta$ to the left.

Repetition of the above switch operations shift the two leg members 15 and 16 to the left stepwise by $\Delta$ each time, where $\Delta$ is a unit linear expansion of the body member 14. When it is desired to move the leg members to the right, the switches $S_1$, $S_2$ and $S_3$ are on-off operated in the reverse order to the above.

The above-described switch operation can be easily automated by the use of a simple control circuit.

Figure 6:
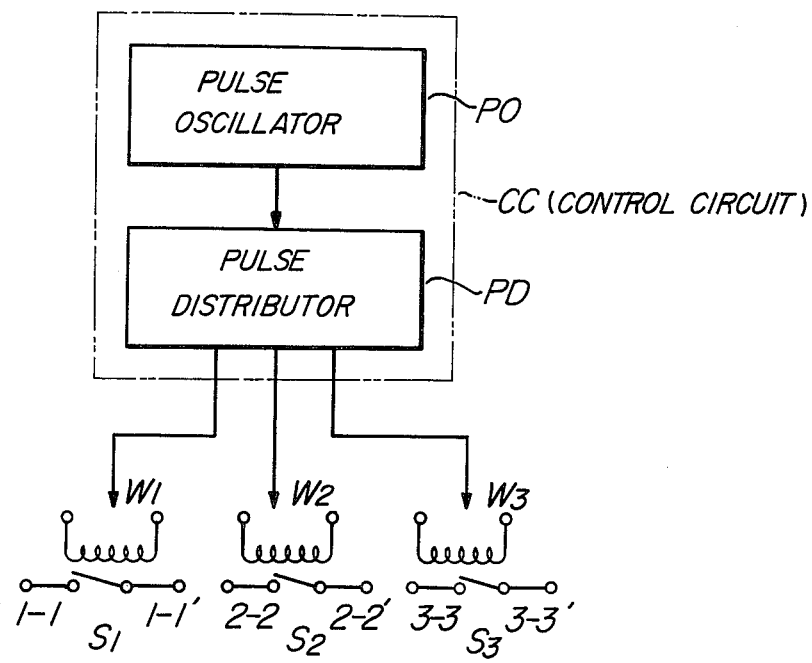
FIGS. 6 and 7 are block diagrams of the switch control circuits used in embodiments of this invention.

FIG. 6 shows an example of such a control circuit. Referring to the figure, a pulse oscillator PO generates pulses which are distributed appropriately in a pulse distributor PD and supplied to the activating windings $W_1$, $W_2$ and $W_3$ of the respective switches $S_1$, $S_2$ and $S_3$ to on-off control said switches in a predetermined order. These switches may also be formed of purely electronic ones such as transistors, as well as electromechanical ones.

Figure 7:
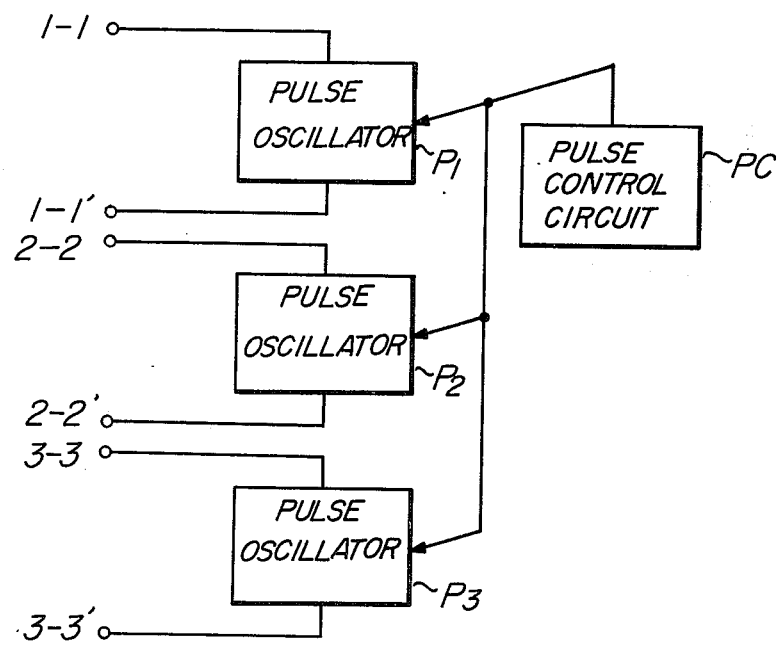

Further, pulse oscillators $P_1$, $P_2$ and $P_3$ may be respectively used as said voltage sources $E_1$, $E_2$ and $E_3$ and switches $S_1$, $S_2$ and $S_3$ as is shown in FIG. 7. Those pulse oscillators supply pulses to said body and leg members in synchronism with each other and in said order of switch operation. In this case, said switches and control circuit can be dispensed with. In the figure, a pulse control circuit PC varies the repetition period of the pulses generated from the oscillators $P_1$, $P_2$ and $P_3$ to control the step speed and exchange the order of the pulse generation to select the direction of movement.

In the above description, the body member 14 is arranged to expand by the voltage applied. It is apparent that the body member 14 may be also arranged to contract by the voltage applied by reversing the polarity. The amount of dilation $\Delta$ is proportional to the applied voltage $E_1$. Thus, the unit step length can be widely varied by adjusting the applied voltage. The step speed can be adjusted by adjusting the repetition speed of a cycle of switch operations. Thus, automation of these switch operations can increase the step speed. Particularly, the use of a pulse oscillator of variable repetition frequency enables the arbitrary change of the step speed.

The amount of dilation of the body member due to the inverse piezoelectric effect is very small. Therefore, fine positioning to an accuracy below one micron can be done very accurately according to the present invention. An object desired to be moved may be fixed or interconnected to one of the leg members.

The fine positioning structure according to the present invention has the following advantages over the conventional mechanical ones. Since a minute mechanical output is directly derived from an electrical input and directly used for fine positioning, the overall structure of a fine positioning device can be arranged much smaller and simpler compared with the conventional ones in which a large mechanical input is transformed into a minute mechanical output through a complicated mechanism of cams, screws, etc. and then used for fine positioning. Further, since an electrical input is directly transformed into a fine positioning output, an object can be finely moved remotely from any place by remote control. Yet further, since a desired minute quantity is directly generated and given to an object without the use of any magnitude reducing means formed of cams, screws, etc., the present positioning is almost free from errors arising from the tolerances due to mechanical portions and from temperature changes and vibrations. Thus, a very high accuracy can be obtained. Further, since only purely electrostatic phenomena are used in transforming an electrical input into a mechanical output, no magnetic affects can be given to charged particles for the use in a charged particle application device and hermetic sealing can be extremely easily done for the use in a high vacuum device.

Figure 5:
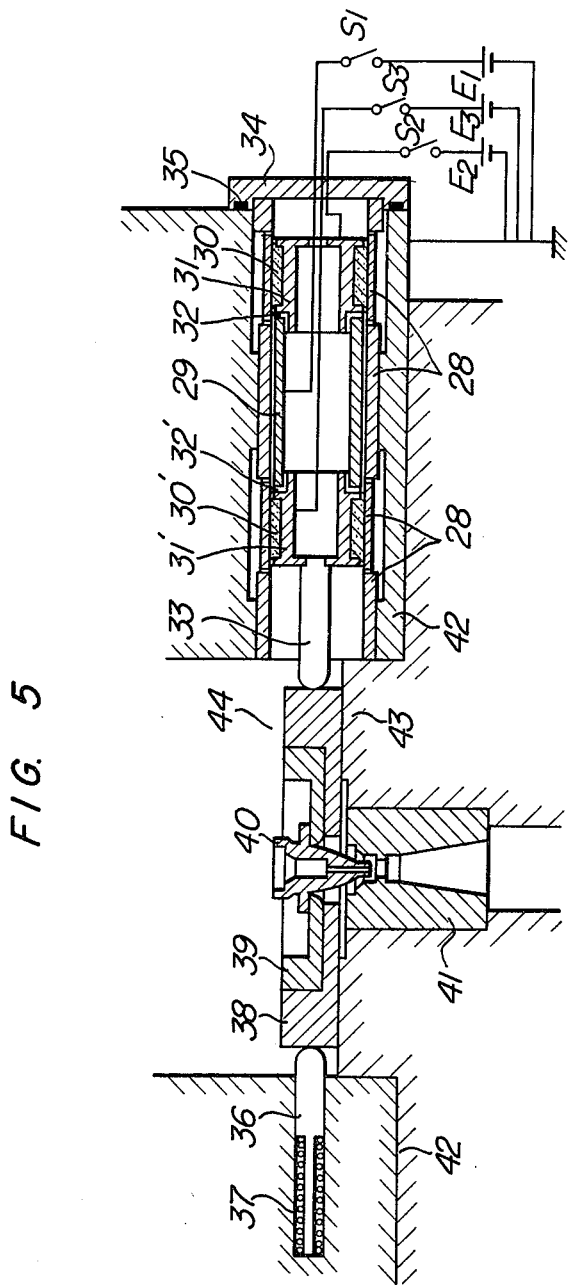
FIG. 5 is a longitudinal cross-section of an embodiment of the present device used in an electron-microscope as a specimen positioning device.

An example will be described referring to FIG. 5, in which the present device is used as the fine positioning device for specimen in an electron-microscope. In the figure, numeral 38 is a specimen plate, 41 an objective lens. A specimen holder 40 is supported on the specimen plate 38 through a holder receiver 39, and contains a specimen. The specimen plate 38 is mounted on the top surface of a magnetic path member 43 and allowed to move in the horizontal direction. In an electron-microscope, the relative position of the specimen (and hence the specimen plate 38) and the object lens 41 should be finely adjusted to the accuracy of the order of an angstrom. The specimen plate 38 can be finely adjusted through the present fine positioning device assembled in the outer wall 42 of a specimen room, a push spring 37, and a push rod 36. Here, all of these parts are assembled in a high vacuum specimen room 44. Only the lead wires for introducing electrical inputs are derived out of the vacuum wall through a hermetic seal 34 and an O-ring 35. Voltage sources $E_1$, $E_2$ and $E_3$ are connected to these lead wires through switches $S_1$, $S_2$ and $S_3$, respectively.

The fine positioning device is assembled in a sleeve 28 fixedly provided in the vacuum wall 42. The inner surface of the sleeve works as the guide plane (substrate surface) of fine positioning. A body member 29 is made of a cylindrical piezoelectric ceramic which may be formed by coating silver electrodes on the inner and outer surfaces of a cylindrical zircon lead-titanate ceramic having an outer diameter of 13 mm $\phi$, a length of 20 mm, and a thickness of 3 mm. The magnitude of dilation of this body member 29 due to the inverse piezoelectric effect is 0.01 to 1 m$\mu$ for a voltage application of 100 to 1000 V. This dilation becomes the unit step length and determines the accuracy of fine positioning. Cylindrical leg members 31 and 31' are fixed to the both ends of the body member 29 through insulators 32 and 32'. Ribbon-shaped sliding members 30 and 30' are fixed on the outer periphery of the leg members 31 and 31' and arranged to slide on the inner surface of the sleeve 28. The sliding members 30 and 30' are formed of conductive rubber or a semiconductive dielectric such as barium titanate ($BaTiO_3$) cermaic, having a specific resistivity of about $10^6$ Ω -cm.

When the switches $S_1$, $S_2$ and $S_3$ are on-off operated in a predetermined order as described before, the leg members 31 and 31' alternately moves stepwise to generate a fine movement. This fine movement is transmitted to the specimen plate 38 through a push rod 33 attached to the leg member 31' to do the desired fine movement of the specimen. Since this fine movement is done with said dilation of the body member 29 taken as a unit step, the specimen can be finely moved to a very high degree of accuracy.

I claim:

1. An apparatus for precisely positioning a specimen holder on an electron microscope, said apparatus comprising a body member made of an inverse piezoelectric material and having two end portions, a pair of leg members formed of an electrically conducting material, one of said leg members being affixed to a respective end portion of said body member, a base plate made of an electrically conducting material for supporting the assembly of said body member and said leg members, a pair of slide members made of a semiconductive material, one of said slide members being interposed between a respective one of said leg members and said base plate being affixed to one of said leg member and said base plate, means for intermittently applying a voltage across said body member so as to cause the body member to dilate by the inverse piezoelectric effect, means for alternately applying a voltage between each of said leg members and said base plate so as to alternately fix said leg members to said base plate by electrostatic force between said leg member and said base plate, and a push rod connected to one of said leg members for finely moving the specimen holder, the specimen holder being mounted for movement on an objective lens of the electron microscope.

2. Apparatus according to claim 1, wherein said means for applying voltage include a plurality of switches and voltage sources.

3. Apparatus according to claim 2, further comprising means for controlling the on-off operations of said switches and the order thereof.

4. Apparatus according to claim 3, wherein said control means includes a pulse oscillator and a pulse distributor.

5. Apparatus according to claim 1, wherein said means for applying voltage include pulse oscillators.

6. Apparatus according to claim 5, further comprising means for varying the frequency of pulses generated from said pulse oscillator.

7. Apparatus according to claim 5, further comprising means for varying the order of pulse oscillation of said pulse oscillators.

8. Apparatus according to claim 2, further comprising means for adjusting the output voltage of said voltage source.

9. Apparatus according to claim 5, further comprising means for adjusting the magnitude of the output pulses of said pulse oscillators.

10. Apparatus according to claim 3, wherein said body member is formed in a hollow cylindrical shape.

* * * * *